(12) United States Patent
Meynants et al.

(10) Patent No.: US 10,170,514 B2
(45) Date of Patent: Jan. 1, 2019

(54) IMAGE SENSOR

(71) Applicant: CMOSIS BVBA, Antwerp (BE)

(72) Inventors: Guy Meynants, Retie (BE); Jan Bogaerts, Waver (BE)

(73) Assignee: CMOSIS BVBA, Antwerp (BE)

( * ) Notice: Subject to any disclaimer, the term of this patent is extended or adjusted under 35 U.S.C. 154(b) by 93 days.

(21) Appl. No.: 14/515,505

(22) Filed: Oct. 15, 2014

(65) Prior Publication Data

US 2016/0112665 A1    Apr. 21, 2016

(30) Foreign Application Priority Data

Oct. 17, 2013    (GB) .................................... 1318404.9

(51) Int. Cl.
| | | |
|---|---|---|
| *H01L 27/00* | (2006.01) | |
| *H01L 27/146* | (2006.01) | |
| *H04N 5/232* | (2006.01) | |
| *H04N 5/355* | (2011.01) | |
| *H04N 5/3745* | (2011.01) | |

(52) U.S. Cl.
CPC .. *H01L 27/14643* (2013.01); *H01L 27/14609* (2013.01); *H04N 5/23245* (2013.01); *H04N 5/3559* (2013.01); *H04N 5/37452* (2013.01)

(58) Field of Classification Search
CPC ............ H04N 5/3741; H01L 27/14643; H01L 27/14609; H01L 27/14636; H01L 27/14612
USPC ...................................................... 250/208.1
See application file for complete search history.

(56) References Cited

U.S. PATENT DOCUMENTS

| | | |
|---|---|---|
| 7,075,049 B2 | 7/2006 | Rhodes et al. |
| 7,432,540 B2 | 10/2008 | McKee |
| 7,705,900 B2 | 4/2010 | Guidash |
| 2005/0051775 A1 | 3/2005 | Meynants |

(Continued)

FOREIGN PATENT DOCUMENTS

| | | |
|---|---|---|
| CN | 102752559 A | 10/2012 |
| EP | 2109306 A2 | 10/2009 |
| JP | 07131720 A | 7/1995 |

OTHER PUBLICATIONS

Extended Search Report, EP 14189293.5 (dated Jan. 26, 2015).

(Continued)

*Primary Examiner* — Georgia Y Epps
*Assistant Examiner* — Kevin Wyatt
(74) *Attorney, Agent, or Firm* — Stein IP, LLC (57) ABSTRACT

An image sensor comprises an array of pixels comprising: a pinned photodiode; a first sense node A; a second sense node B; a transfer gate TX connected between the pinned photodiode and the first sense node A; a first reset transistor M3 connected between a voltage reference line Vrst and the second sense node B; a second reset transistor M4 connected between the first sense node A and the second sense node B; and a buffer amplifier M1 having an input connected to the first sense node A. The control logic is arranged to operate the pixels in a low conversion gain mode and in a high conversion gain mode. In each of the conversion gain modes the control logic is arranged to operate one of a first reset control line RS1 and a second reset control line RS2 to continuously switch on one of the first reset transistor M3 and the second reset transistor M4 during a readout period of an operational cycle of the pixels.

18 Claims, 5 Drawing Sheets

(56) References Cited

U.S. PATENT DOCUMENTS

| | | |
|---|---|---|
| 2005/0275455 A1* | 12/2005 | DeGeronimo ............ H03F 1/34 |
| | | 330/109 |
| 2007/0035649 A1 | 2/2007 | McKee |
| 2008/0237446 A1 | 10/2008 | Oshikubo et al. |
| 2009/0096890 A1* | 4/2009 | Li .......................... H04N 3/155 |
| | | 348/229.1 |
| 2010/0252717 A1 | 10/2010 | Dupont |
| 2011/0187906 A1* | 8/2011 | Chaji .................. H04N 5/35518 |
| | | 348/300 |
| 2011/0315854 A1 | 12/2011 | Janesick |
| 2012/0153123 A1* | 6/2012 | Mao .................... H04N 5/35509 |
| | | 250/208.1 |
| 2012/0256077 A1 | 10/2012 | Yen |
| 2013/0020466 A1* | 1/2013 | Ayers ................ H01L 27/14609 |
| | | 250/208.1 |
| 2013/0033631 A1 | 2/2013 | Mabuchi |
| 2015/0062364 A1* | 3/2015 | Nakamura ........... H04N 5/3559 |
| | | 348/218.1 |

OTHER PUBLICATIONS

Lauterman et al., "Comparison of Global Shutter of Pixels for CMOS Image Sensors . . . "; Teledyne Imaging Sensors (4 pgs.).
Ide et al., "A Wide Dir and Linear Response CMOS Image Sensor With Three Photocurrent Intergrations in Photodiodes . . . "; IEEE Journal of Solid-Stqte Circuits; vol. 43 No. 7 (Jul. 7, 2008 (11 pgs.).
Akahane et al., A Sensitivity with Linearity Improvement . . . ; IEEE Journal of Solid-State Circuits, vol. 41 No. 4 (Apr. 2006 (8 pgs.).

* cited by examiner

IMAGE SENSOR

RELATED APPLICATION

This application claims the benefit of the filing date of British patent application 1318404.9 filed on Oct. 17, 2013, which is incorporated herein by reference.

TECHNICAL FIELD

This invention relates to an image sensor comprising an array of pixels.

BACKGROUND

Figure 1:
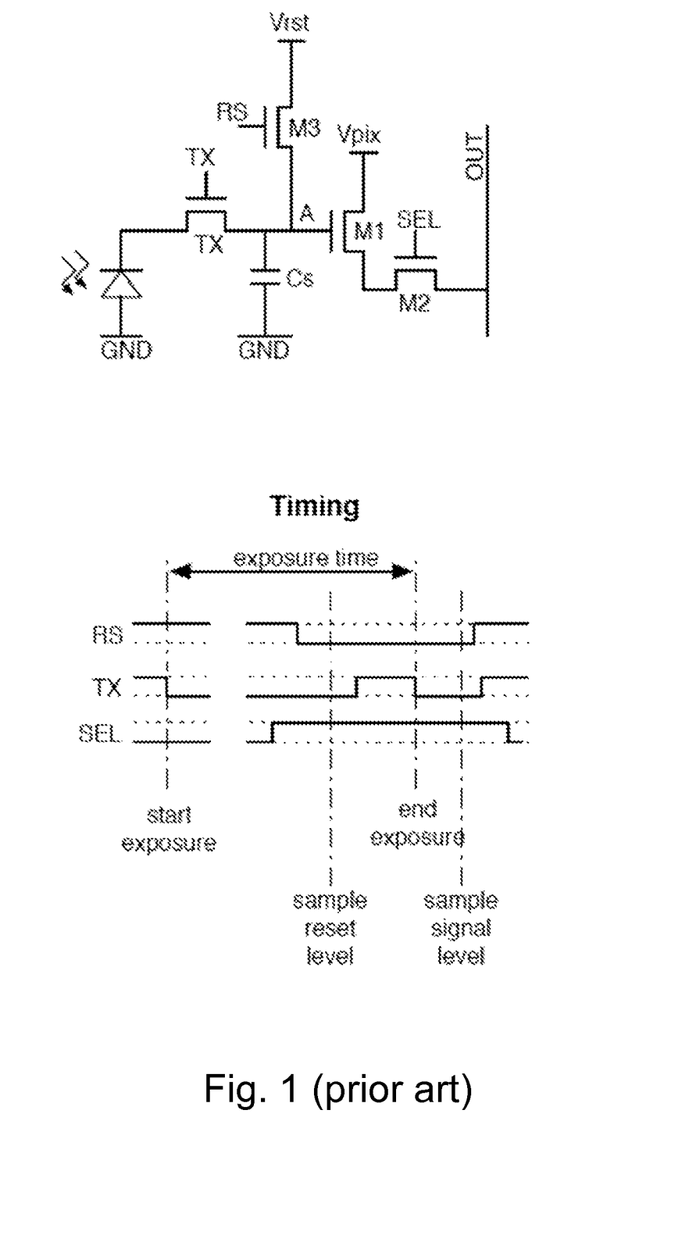
FIG. 1 shows a conventional 4-transistor pinned-diode active pixel with a fixed conversion gain.

FIG. 1 shows an example of a conventional four transistor (4T) active pixel used in a Complementary Semiconductor Oxide Semiconductor (CMOS) image sensor. The pixel comprises a pinned photodiode, a transfer gate TX and a sense node A. A buffer amplifier, such as source follower M1, connects to the sense node A. A selection transistor M2 connects the output of the buffer amplifier M1 to a column bus when the pixel is read. A reset transistor M3 also connects to the sense node A in order to set the voltage on the sense node A at a certain level before charge transfer. The transfer transistor TX transfers substantially all charges from the pinned diode to the sense node after reset of the sense node. The pixel is read before and after this charge transfer and the difference between these two samples will be output by the image sensor as the pixel value. This differential operation is called correlated double sampling (CDS).

The conversion gain of the pixel is determined by the capacitance of the sense node A. Typically, conversion gain is expressed in microvolts per electron ($\mu V/e-$) and specifies the signal change that is measured when an electron is added to the sense node. The capacitance of the sense node is composed of several parts. Part of this capacitance is a parasitic capacitance such as the junction capacitance of the transfer gate and reset drain junctions, the sidewall capacitance of these junctions, the gate-drain overlap capacitances of the transfer gate and the reset transistor, routing capacitance of the contact of the sense node to the input of the buffer amplifier. In some cases, there is some intentional capacitance added through capacitor devices, such as metal-metal or poly-poly capacitor plates, or metal-metal fringe capacitors or other capacitor devices as typically used in CMOS integrated circuits.

CMOS pixels may be operated in a wide variety of light conditions and signal levels. At high light levels and/or long exposure times, the amount of accumulated charges can be large. This has to be converted into a voltage by a large capacitor. At low light levels or short exposure times, the amount of charges collected can be small. The conversion gain has to be chosen for the expected maximum signal that is expected. If that is large, the conversion gain is low. Small signals, such as dark areas in an image, are converted into a very small voltage.

The charge capacity of the pixel, expressed in electrons, is the maximum signal that the pixel can contain. It can be limited by the photodiode, or by clipping in the readout path or on the sense node. Temporal read noise refers to the temporal variation of a pixel when successive readings are done of the same signal. This is specified in dark conditions, and expressed in electrons. The ratio between the charge capacity and the read noise is the dynamic range. For a higher dynamic range, the noise must be reduced. The most significant noise contribution of a CMOS pixel comes typically from the in-pixel buffer amplifier. In most cases a source follower is used, and the read noise of the pixel, after correlated double sampling, is determined by the thermal and low frequency (1/f and random telegraph signal) noise of the pixel source follower. To readout small charge packets, it is of interest to increase the conversion gain as much as possible in order to reduce the contribution of the noise to the signal. However, if the expected amount of charge is large, the conversion gain will be designed at a lower value, which results in higher read noise.

Typical camera systems operate the image sensor under a variety of gain settings, which are adjusted to the exposure settings and light level, and by the preference of the user of the camera. Under low light conditions, a higher gain is applied.

Figure 2:
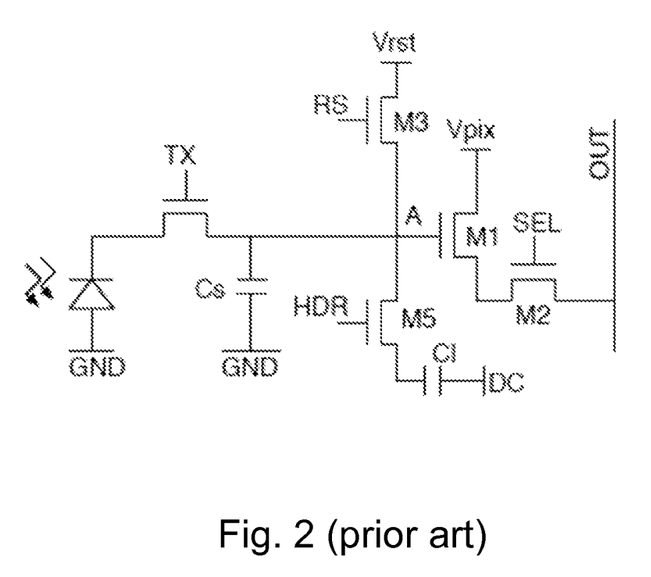
FIG. 2 shows a pinned diode active pixel with a selectable conversion gain.

Pixels with selectable conversion gain have been proposed in several patents and patent applications. U.S. Pat. No. 7,075,049 shows a structure where an additional switch is connected to the sense node. This switch connects an extra capacitor to the sense node. When the switch is on, the pixel has a low conversion gain. This setting is used under high exposure values. When the switch is off, the pixel has a high conversion gain. This setting is used under low exposure values and offers lower read noise of the pixel. U.S. Pat. No. 7,432,540 shows a similar principle, describing a particular implementation of the switch and the capacitor. U.S. Pat. No. 7,705,900 shows a configuration of pixels where sense nodes of neighbour pixels can be connected together by additional switches. These switches allow summing the signal of two neighbour pixels. But these switches also allow increasing the sense node capacitance by connecting the sense nodes of one or more adjacent pixels to the sense node of the pixel that is readout. This allows modification of the sense node capacitance according to the desired conversion gain. FIG. 2 shows an pixel similar as described in U.S. Pat. No. 7,075,049 where an additional transistor M5 connects an additional capacitor Cl to the sense node A when the HDR control signal is high. When HDR is high, the conversion gain is low and proportional to 1/(Cs+Cl). When HDR is low, the conversion gain is high and proportional to 1/Cl.

All the above embodiments make use of an additional transistor (switch) connected to the sense node A. Besides the drain of the transfer gate and the source of the reset transistor, and the input of the source follower, an additional transistor is connected to the sense node A. Connecting an additional transistor increases the parasitic capacitance of the sense node. This increases the capacitance of the sense node, and results in a lower maximum conversion gain for the high gain case. This limits the minimum temporal read noise that can be achieved with such pixel.

US 2008/0237446 A1 describes an image sensor which is operable in a high sensitivity mode and a low sensitivity mode.

SUMMARY

An aspect of the disclosure provides an image sensor comprising an array of pixels and control logic which is arranged to control operation of the pixels, each of the pixels comprising:

a pinned photodiode;
a first sense node;
a second sense node;
a transfer gate connected between the pinned photodiode and the first sense node;
a first reset transistor connected between a voltage reference line and the second sense node;

a second reset transistor connected between the first sense node and the second sense node; and
a buffer amplifier having an input connected to the first sense node;
the image sensor further comprising:
a first reset control line connected between the control logic and the first reset transistor in each of a plurality of pixels of the array;
a second reset control line connected between the control logic and the second reset transistor in each of the plurality of pixels of the array;
and wherein the control logic is arranged to selectively operate the pixels in a low conversion gain mode and in a high conversion gain mode and in each of the conversion gain modes the control logic is arranged to operate one of the first reset control line and the second reset control line to continuously switch on one of the first reset transistor and the second reset transistor during a readout period of an operational cycle of the pixels.

The control logic can be arranged, in each of the conversion gain modes, to operate the first reset control line and the second reset control line to switch off at least one of the first reset transistor and the second reset transistor during a non-readout period of the operational cycle of the pixels.

The control logic can be arranged to operate one of the first reset control line and the second reset control line to switch on the other of the first reset transistor and the second reset transistor before the readout period, and to switch off the other of the first reset transistor and the second reset transistor during the readout period.

The control logic can be arranged to operate one of the first reset control line and the second reset control line to continuously switch on one of the first reset transistor and the second reset transistor during all of an operational cycle of the pixels.

Each of the pixels can further comprise a selection transistor for selectively connecting an output of the buffer amplifier to a readout line. The image sensor can further comprise a selection control line connected between the control logic and the selection transistor in each of the plurality of pixels of the array. The control logic can be arranged to continuously operate one of the first reset control line and the second reset control line to continuously switch on one of the first reset transistor and the second reset transistor during a period when the select control line is operated to switch on the select transistor.

The second sense node can be connected to a parasitic capacitance or to an explicit capacitive device.

The second sense node can be connected to one of: a supply rail, ground.

The plurality of pixels can be a row of pixels of the array.

The control logic can be arranged to select a conversion gain mode on a per row basis.

The control logic can be arranged to operate all of the pixels in the array in the same conversion gain mode.

The control logic can be arranged to sample a value of the first sense node after the first sense node has been reset and to sample a value of the sense node after charge has been transferred from the pinned photodiode to the first sense node.

The term "pixel" in this specification includes pixels with dedicated readout circuitry and pixels with shared readout circuitry. In the case of pixels with shared readout circuitry, each pixel has a first reset transistor, a second reset transistor and a buffer amplifier, and the first reset transistor, second reset transistor and buffer amplifier are shared between two or more pixels.

An advantage of an embodiment of the present disclosure is a reduction in power consumption. Each of the reset control lines connect to a row of pixels. Each time the reset control line is turned on/off there is a charge/discharge of the control line. Operating a reset transistor continuously can reduce power consumption and can reduce interference and mismatch between the pixels which can arise from switching the reset transistor on/off at a higher rate.

An advantage of an embodiment of the present disclosure is that a high conversion gain mode and a low conversion gain mode is possible without requiring to connect an additional transistor to the first sense node, compared to a conventional active pixel.

Another advantage is improved yield in large area devices.

The pixel array can be manufactured using a technology such as Complementary Metal Oxide Semiconductor (CMOS).

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Throughout this specification, it should be noted that the term "row" and "column" can be interchanged. Also, the term "row" does not imply a particular orientation of the array.

Figure 3:
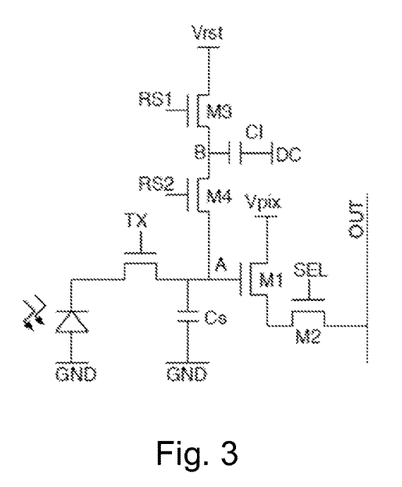
FIG. 3 shows a pinned diode active pixel according to an embodiment of the invention.

FIG. 3 shows an embodiment of the pixel architecture. An additional reset transistor M4 is added, when compared to the four transistor active pixel of FIG. 1. The pixel of FIG. 3 has two reset transistors M3, M4, connected in series between a reset voltage supply line Vrst and a first sense node A. Capacitance C1 is shown in FIG. 3 connected between a node B and a DC Bias voltage. More generally, the capacitance C1 can be connected to ground, substrate, supply or a DC bias voltage. Node B is used, in this pixel, as a second sense node. Sense node A connects to the drain of the transfer gate TX and to the input of the buffer amplifier in the pixel (shown as a source follower M1). Sense node A has a capacitance Cs. Cs is designed with a very small value, resulting in a high conversion gain. Typically, Cs will only be composed of parasitic capacitances of node A. Cl can be a parasitic capacitance but typically can also comprise an explicit capacitive device, such as a plate or fringe capacitor. The additional reset transistor can be used to switch conversion gain of the pixel between two values: a high conversion gain (for use when imaging small/dark signals) and a low conversion gain (for use when imaging large/bright signals). Reset transistor M3 is operable by a reset control line RS1 and reset transistor M4 is operable by a reset control line RS2.

Figure 4:
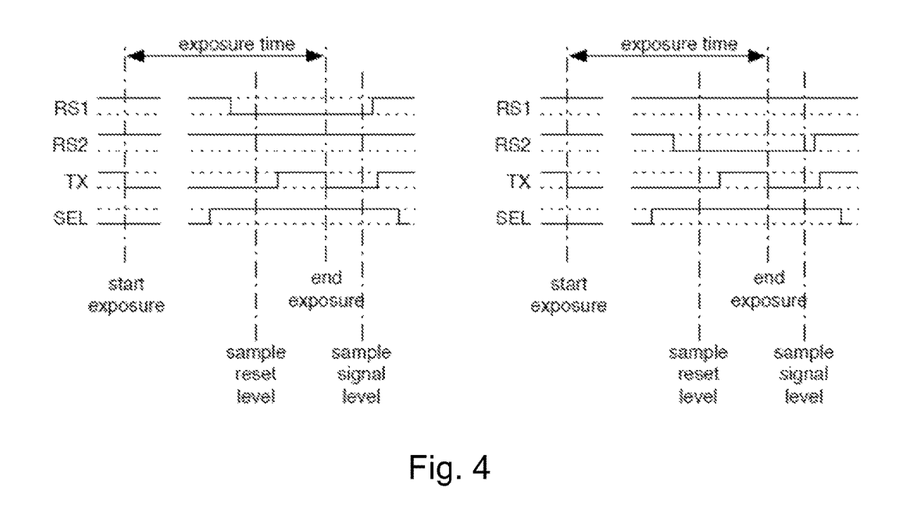
FIG. 4 shows a timing scheme for the pixel of FIG. 3 in high and low gain modes.

FIG. 4 shows an example timing scheme for the pixel of FIG. 3. FIG. 4 shows an operational cycle of a pixel. The sequence of operations shown in FIG. 4 is repeated for each operational cycle. The pixel is selectively operated in one of two possible modes, depending on the required conversion gain. One of the two reset control lines (RS1, RS2) is continuously switched on for high or low gain operation. The other control line (RS1, RS2) is used to reset the sense node.

In the low conversion gain mode, reset control line RS2 is operated to continuously switch on reset transistor M4 during the readout of the pixel array. This connects sense nodes A and B together, and capacitance Cl is continuously connected to Cs. The combined capacitance of the sense nodes A, B is (Cs+Cl). Reset control line RS1 is operated to reset the sense node before charge transfer.

In the high conversion gain mode, reset control line RS1 is operated to continuously switch reset transistor M3 on, which keeps the intermediate node B at a high voltage. Reset control line RS2 is operated to switch on reset transistor M4 before charge transfer to the sense node A. This resets the sense node A. In this mode, only sense node A is used and the capacitance of the sense node is Cs.

In both conversion gain modes, sense node A (or sense nodes A, B) is sampled on two occasions:
after sense node A has been reset, and before the transfer of charge from the pinned photodiode to the sense node. This first sample represents the reset level of the pixel.
after the transfer of charge from the pinned photodiode to the sense node. This second sample represents the signal level of the pixel. The signal level is a signal which varies according to brightness of the pixel in the scene being imaged.

In the low conversion gain mode, the reset transistor resets both sense nodes A, B and the two samples are taken while the sense nodes A, B are connected together by reset transistor M4.

Capacitor Cs is designed for a high conversion gain. In a modern CMOS image sensor process, the gain in the high conversion gain mode will be around 125 µV/e− (if Cs=1.28 fF) or even higher. More generally, it can be at least 80 µV/e−. Cl is used to reduce the conversion gain in low conversion gain mode. The extra capacitance can result in a total sense node capacitance of for example 6.4 fF which reduces the conversion gain to 25 µV/e−. This will be used when the pixel has to readout large charge packets. The swing on the sense node is limited. The maximum level is set by the voltages for the reset of the pixel and will be about 2.5V. The minimum voltage is determined by the pinning voltage of the pinned photodiode. Advantageously, the sense node should always operate higher than this voltage in order to ensure a full transfer of charges from the photodiode to the sense node. Typical pinning voltages are around 1.2V and typically some margin is used to avoid process variation. Then the minimum voltage on the sense node is about 1.5V. The swing is then typically about 1V. In this example, the high gain readout is able to handle 8000 electrons. The low gain readout is able to handle 40,000 electrons. The noise of the source follower is about a fixed voltage level, for example 250 µV RMS. This results in a read noise of 10 e− RMS in low gain mode, and 2 e− RMS in high gain mode. The dynamic range is then 40,000 e−/10 e−=4000:1 in low gain mode, but also 8000 e−/2 e−=4000:1 in high gain mode. This means that the dynamic range is high for both modes. In a single gain pixel, the conversion gain for the above example is 25 µV/e−, which results in a maximum charge and noise as for the low gain case. If the pixel signal is then amplified 5× in the readout circuit, the dynamic range drops by a factor 5, resulting in a dynamic range of 800:1 for high gain mode.

If both sense nodes have same capacitance, the conversion gain is half in the low gain mode. This is approximately the maximum conversion gain that could be achieved in low gain mode, if both sense nodes are designed for minimal capacitance.

There are also advantages for fixed pattern noises and other structural noise sources which are caused by the readout circuits of the image sensor. Since a higher charge conversion gain is used in the pixel, non-uniformities of the readout circuits have lower effect under high gain conditions.

An advantage of an embodiment of the present invention is that no additional transistor must be connected to the sense node A. In FIG. 1 sense node A is connected to a transfer gate TX and a reset transistor M3. In FIG. 3 sense node A is also only connected to a transfer gate TX and a reset transistor M4. This allows to increase the conversion gain in high gain mode to the highest possible value possible in the technology, only limited by parasitic capacitances of the sense node.

Operating one of the reset control lines continuously has an advantage of providing a power saving. Each of reset control lines RS1, RS2 couple to a plurality of pixels. Typically, there is a reset control line RS1 and a reset control line RS2 per row of pixels. In large pixel arrays, the number of pixels connected to each reset control line can be of the order of several thousand pixels. Each time the reset control line is turned on/off there is a charge/discharge of the control line. The power consumed for this charging and discharging of the control line can be expressed as:

$$P = f \ast C \ast V^2 / 2$$

where: f=switching frequency, C=capacitance of the control line, V=voltage swing. This figure is multiplied with the amount of rows present on the image sensor to calculate the total power required to pulse the control lines. The total power saving with the non-pulsed operation is then P*Nrows (where Nrows is the amount of rows on the pixel array). This can be substantial for large pixel arrays and/or at high operational speeds. The switching of the reset control lines can also cause interference and mismatch between the pixels.

The plurality of pixels connected to the reset control lines RS1, RS2 can be operated in the same manner. With reset control lines RS1, RS2 per row, this means that a row of pixels are operated in the same manner. It is possible for the conversion gain mode to vary on a per row basis, according to requirements of the scene being imaged (e.g. pixels for a "dark" row of an image are operated in a high conversion gain mode, pixels for a "bright" row of an image, or any brightness level which is likely to saturate the capacitance Cs are operated in low conversion gain mode). Alternatively, all of the rows of the pixel array can be operated with the same conversion gain mode.

An additional advantage of embodiments relates to yield of large area image sensor devices. A defect on a control line in a pixel array can consist of a short between one of the horizontal control lines, such as the reset or select lines, and a vertical line such as the pixel power supply line or the output line. When the vertical power supply line is shorted to the reset line in a 4-transistor pixel such as shown in FIG. 1 or a pixel such as shown in FIG. 2, the line will be permanently reset and the row cannot be readout. In the current invention, two reset lines are present. When one of the two lines is shorted to a vertical control line, the row can still be readout in one of the two gain modes. This allows to recover the pixel data of that row, with one of the two gain levels. A missing row will not be present when the image is read in one of the two gain modes of the pixel. Furthermore, the data from the functional gain mode can be used to correct the missing row in the non-functional gain mode. To do this, the sensor readout circuit should have provisions to readout the row with the defect on one of its reset lines in the functional gain mode. The defect can be detected during testing of the image sensor or during a camera calibration process. Once detected, camera or image sensor logic circuits can make sure that the row with the defect is readout in its operational gain mode for both gain modes, and the camera image processing can make sure that the gain difference on this particular row is corrected.

Figure 5:
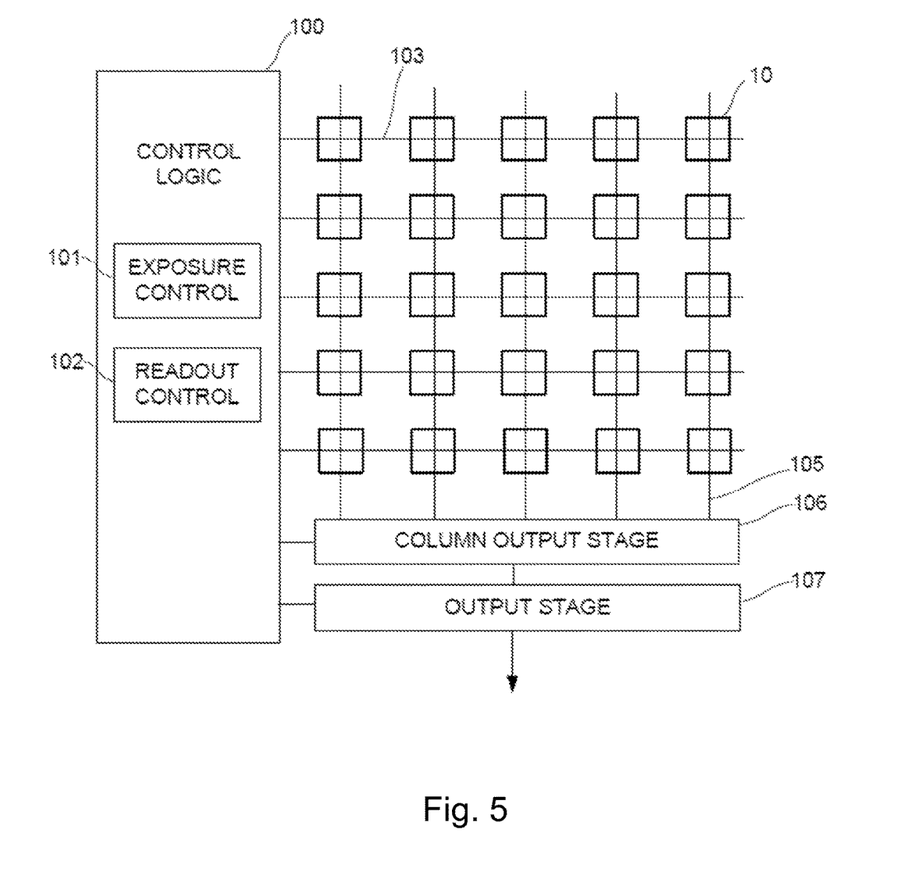
FIG. 5 shows an image sensor comprising an array of pixels of FIG. 3.

FIG. 5 shows an image sensor comprising an array of pixel structures 10 of the types described above and shown in FIG. 3. Control logic 100 controls operation of the pixel array and output stages 106, 107. Control logic 100 comprises logic 101 for controlling exposure of pixels 10 and logic 102 for controlling readout of pixels 10. Exposure control logic 101 can comprise line driver circuitry for generating control signals on control lines 103 (which include reset control lines RS1, RS2). Readout control logic 102 can comprise row selection/line driver circuitry for generating control signals on control lines 103 to control readout of pixels 10. Control logic 100 can control: resetting of the pixels to control the start of an exposure period (including operation of transfer gates and reset switch via reset control lines RS1, RS2); operation of transfer gates to transfer charges to the sense node; operation of readout switches by a control signal to control readout from pixels.

The control logic 100 can be stored in hard-coded form, such as in an Application Specific Integrated Circuit, or it can be stored in some form of reconfigurable processing apparatus, such as a logic array (programmable array, reconfigurable array) or a general-purpose processor which executes control software. All of the elements shown in FIG. 5 can be provided on a single semiconductor device or the elements can be distributed among several separate devices. In the case of a 3D integrated chip the pixel array is provided on a first wafer which is bonded to a second wafer containing control logic. Column output stage 106 can comprise column processing circuitry dedicated to each column, such as: an analog-to-digital converter (ADC), one or more amplifiers, storage to store values in order to perform features such as correlated double sampling (CDS). An output stage 107 can perform further processing of the signals received from columns of the array.

In the timing scheme of FIG. 4, one of the two reset control lines (RS1, RS2) is operated so as to continuously switch on one of the reset transistors RS1, RS2 during low and high conversion gain operation during all of an operational cycle.

More generally, one of the two reset control lines (RS1, RS2) can be operated so as to continuously switch on one of the reset transistors RS1, RS2 during a readout period of the operational cycle. The readout period is the period during which the sense nodes are reset and then one (e.g. just signal level) or typically two (e.g. reset level, signal level) signal values are readout from the pixel. In FIG. 4, the readout period can be defined as the time during which the select transistor M2 is switched on. Select transistor M2 is operated by control line SEL.

During other, non-readout periods of the operational cycle of the pixel, one or both of the reset control lines RS1, RS2 can be operated to switch off at least one of the first reset transistor M3 and the second reset transistor M4. Stated another way, the control logic can be arranged to operate the first reset control line RS1 and the second reset control line RS2 to switch off at least one of the first reset transistor M3 and the second reset transistor M4 during a period when the select control line SEL causes the select transistor M2 to be switched off.

Figure 6:
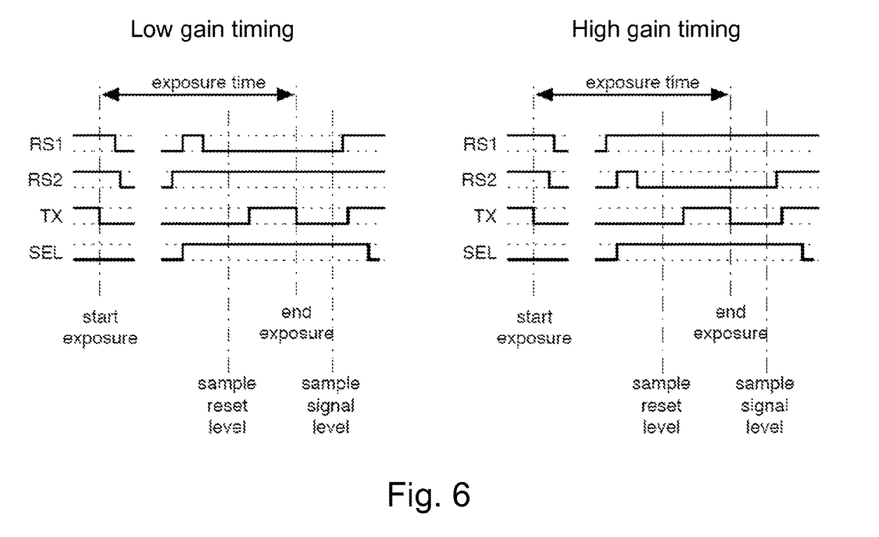
FIG. 6 shows another timing scheme for the pixel of FIG. 3 in high and low gain modes.
Figure 7:
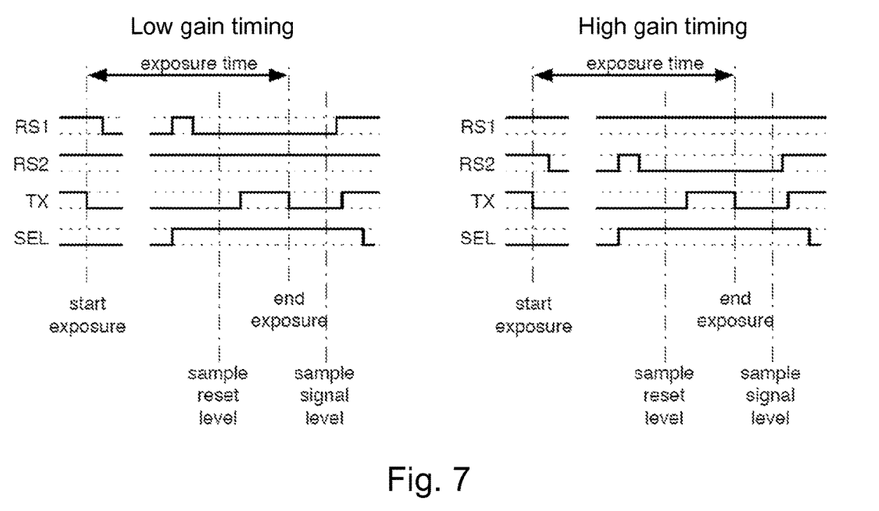
FIG. 7 shows another timing scheme for the pixel of FIG. 3 in high and low gain modes.

FIGS. 6 and 7 shows timing schemes for the pixel of FIG. 3. FIGS. 6 and 7 each show one operational cycle of a pixel. The pixel is operated in one of two possible modes, depending on the required conversion gain. In the timing scheme of FIG. 6, one of the reset control lines is operated so as to continuously switch on one of the reset transistors RS1, RS2 during a readout period of the operational cycle. During a non-readout time (e.g. when SEL is low), both of the reset control lines RS1, RS2 are operated so as to turn off the reset transistors M3, M4. In the timing scheme of FIG. 7, one of the reset control lines is operated so as to continuously switch on one of the reset transistors RS1, RS2 during all of an operational cycle. During a non-readout time (e.g. when SEL is low), the other of the reset control lines RS1, RS2 is operated so as to turn off the respective reset transistor M3, M4. The other of the reset control lines (RS1 in low gain mode, RS2 in high gain mode) is operated so as to turn on the respective reset transistor M3, M4 for a short period to reset the sense node(s) before the reset level is sampled.

It has been described how one of the reset transistors is switched on continuously during at least the readout period of an operational cycle of a pixel. The other reset transistor (i.e. the one which is not continuously switched on during readout) is switched on before the readout period to reset the first sense node and is switched off during the readout period.

The embodiments described above are based on a 4T pixel, with an additional reset transistor. The reset transistor, and operation of the pixel, can be applied to other types of pixel, such as global shutter pixels which include a charge storage element or a voltage sampling/storage element in the pixel. Examples of global pixels with a voltage storage element are described in EP 2 109 306. Examples of global shutter pixels with charge storage in the pixel are described in S. Lauxtermann, Adam Lee, John Stevens, and Atul Joshi, "Comparison of Global Shutter Pixels for CMOS Image Sensors", Proceedings of the International Image Sensor Workshop 2007, page P 12 (available on www.imagesensors.org).

The pixel array can comprise an array where each pixel has dedicated readout circuitry, where the readout circuitry comprises the first and second reset transistors, buffer amplifier and select transistor. In another embodiment, multiple pixels may share a common readout circuitry. Readout circuitry in the form of: the first and second reset transistors M3, M4, buffer amplifier M1 and select transistor M2 is shared by two or more pixels. Each pixel has a pinned photodiode and a transfer gate. Consider that readout circuitry is shared by two pixels. A first pixel comprises a first pinned photodiode, a first transfer gate and the shared readout circuitry. A second pixel comprises a second pinned photodiode, a second transfer gate and the same shared readout circuitry. The first pixel and the second pixel can be read, in turn, by the same shared readout circuitry. With shared readout circuitry comprising shared reset transistors, one reset control line is operated so as to switch one reset transistor on continuously during readout and the other reset control line can be operated so as to switch the other reset transistor on briefly during readout to reset the sense node between reading out different pixels. A larger number of pixels can share the same readout circuitry. The term "pixel" in this specification includes pixels with dedicated readout circuitry and pixels with shared readout circuitry.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to an item refers to one or more of those items. The term "comprising" is used herein to mean including the method blocks or elements identified, but that such blocks or elements do not comprise an exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the invention.

The invention claimed is:

1. An image sensor comprising an array of pixels and control logic which is arranged to control operation of the pixels, each of the pixels comprising:
   a pinned photodiode;
   a first sense node;
   a second sense node;
   a transfer gate connected between the pinned photodiode and the first sense node;
   a first reset transistor connected between a voltage reference line and the second sense node;
   a second reset transistor connected between the first sense node and the second sense node; and
   a buffer amplifier having an input connected to the first sense node;
   the image sensor further comprising:
   a first reset control line connected between the control logic and the first reset transistor in each of a plurality of pixels of the array;
   a second reset control line connected between the control logic and the second reset transistor in each of the plurality of pixels of the array;
   wherein the control logic is arranged to selectively operate the pixels in a low conversion gain mode and in a high conversion gain mode and in each of the conversion gain modes the control logic is arranged to operate one of the first reset control line and the second reset control line to continuously switch on one of the first reset transistor and the second reset transistor during a readout period of an operational cycle of the pixels and;
   wherein, in each of the conversion gain modes the control logic is arranged to operate the first reset control line and the second reset control line such that the first reset transistor and the second reset transistor are switched on during a non-readout period of the operational cycle of the pixels;
   wherein for the low conversion gain mode;
      the second reset transistor is switched on during a readout period, and the first reset control line is operated to switch on the first reset transistor to reset the first sense node and
   for the high conversion pain mode;
      the first reset transistor is switched on during a readout period, and the second reset control line is operated to switch on the second reset transistor to reset the first sense node.

2. An image sensor according to claim 1 wherein the second sense node is connected to a parasitic capacitance.

3. An image sensor according to claim 1 wherein the second sense node is connected to an explicit capacitive device.

4. An image sensor according to claim 1 wherein the second sense node is connected to one of: a supply rail, ground.

5. An image sensor according to claim 1 wherein the plurality of pixels are a row of pixels of the array.

6. An image sensor according to claim 5 wherein the control logic is arranged to select a conversion gain mode on a per row basis.

7. An image sensor according to claim 1 wherein the control logic is arranged to operate all of the pixels in the array in the same conversion gain mode.

8. An image sensor according to claim 1 wherein conversion gain in the high conversion gain mode is at least 80 $\rho V/e-$.

9. An image sensor according to claim 1 wherein conversion gain in the low conversion gain mode is less than half of the conversion gain of the high conversion gain mode.

10. An image sensor according to claim 1, wherein each of the pixels further comprises a selection transistor for selectively connecting an output of the buffer amplifier to a readout line, the image sensor further comprising a selection control line connected between the control logic and the selection transistor in each of the plurality of pixels of the array, and wherein the control logic is arranged to continuously operate one of the first reset control line and the second reset control line to continuously switch on one of the first reset transistor and the second reset transistor during a period when the select control line is operated to switch on the select transistor.

11. An image sensor according to claim 1 wherein the control logic is arranged to sample a value of the first sense node after the first sense node has been reset and to sample a value of the first sense node after charge has been transferred from the pinned photodiode to the first sense node.

12. An image sensor comprising an array of pixels and control logic which is arranged to control operation of the pixels, each of the pixels comprising:
   a pinned photodiode;
   a first sense node;
   a second sense node;
   a transfer gate connected between the pinned photodiode and the first sense node;
   a first reset transistor connected between a voltage reference line and the second sense node;
   a second reset transistor connected between the first sense node and the second sense node; and
   a buffer amplifier having an input connected to the first sense node;
the image sensor further comprising:
   a first reset control line connected between the control logic and the first reset transistor in each of a plurality of pixels of the array;
   a second reset control line connected between the control logic and the second reset transistor in each of the plurality of pixels of the array;
wherein the control logic is arranged to selectively operate the pixels in a low conversion gain mode and in a high conversion gain mode and in each of the conversion gain modes the control logic is arranged to operate one of the first reset control line and the second reset control line to continuously switch on one of the first reset transistor and the second reset transistor during a readout period of an operational cycle of the pixels;
wherein in each of the conversion gain modes the control logic is arranged to operate the first reset control line and the second reset control line to switch off at least an other one of the first reset transistor and the second reset transistor during a non-readout period of the operational cycle of the pixels;
   wherein for the low conversion gain mode;
      the second reset transistor is switched on during a readout period, and the first reset control line is operated to switch on the first reset transistor to reset the first sense node and
   for the high conversion gain mode;
      the first reset transistor is switched on during a readout period, and the second reset control line is operated to switch on the second reset transistor to reset the first sense node.

13. An image sensor according to claim 12 wherein the control logic is arranged to operate one of the first reset control line and the second reset control line to switch on the other of the first reset transistor and the second reset transistor before the readout period, and to switch off the other of the first reset transistor and the second reset transistor during the readout period.

14. An image sensor according to claim 12 wherein in each of the conversion gain modes the control logic is arranged to operate one of the first reset control line and the second reset control line to continuously switch on one of the first reset transistor and the second reset transistor during all of an operational cycle of the pixels.

15. An image sensor according to claim 12 wherein each of the pixels further comprises a selection transistor for selectively connecting an output of the buffer amplifier to a readout line, the image sensor further comprising a selection control line connected between the control logic and the selection transistor in each of the plurality of pixels of the array, and wherein the control logic is arranged to continuously operate one of the first reset control line and the second reset control line to continuously switch on one of the first reset transistor and the second reset transistor during a period when the select control line is operated to switch on the select transistor.

16. An image sensor according to claim 12 wherein the control logic is arranged to sample a value of the first sense node after the first sense node has been reset and to sample a value of the first sense node after charge has been transferred from the pinned photodiode to the first sense node.

17. An image sensor according to claim 12 wherein in each of the conversion gain modes, the control logic is arranged to operate the first reset control line and the second reset control line to turn off both reset transistors during a non-readout period of the operational cycle of the pixels.

18. An image sensor according to claim 12 wherein in each of the conversion gain modes, the control logic is arranged to operate the first reset control line and the second reset control line so as to continuously switch on the one of the first reset transistor and the second reset transistor and to turn off the other one of the first reset transistor and the second reset transistor during a non-readout period of the operational cycle of the pixels.

* * * * *

UNITED STATES PATENT AND TRADEMARK OFFICE
CERTIFICATE OF CORRECTION

PATENT NO. : 10,170,514 B2
APPLICATION NO. : 14/515505
DATED : January 1, 2019
INVENTOR(S) : Guy Meynants and Jan Bogaerts Page 1 of 1

It is certified that error appears in the above-identified patent and that said Letters Patent is hereby corrected as shown below:

In the Claims

Column 10, Lines 47-48, (approx.) currently written as:
8. An image sensor according to claim 1 wherein conversion gain in the high conversion gain mode is at least 80 pV/e-.

Please correct to:
8. An image sensor according to claim 1 wherein conversion gain in the high conversion gain mode is at least 80 μV/e-.

Signed and Sealed this
Twenty-third Day of April, 2019

Andrei Iancu
*Director of the United States Patent and Trademark Office*